United States Patent
Ban et al.

(10) Patent No.: US 11,682,342 B2
(45) Date of Patent: Jun. 20, 2023

(54) LIGHT EMITTING DISPLAY APPARATUS FOR SENSING CHARACTERISTIC CHANGE OF TRANSISTOR IN GATE DRIVER

(71) Applicant: LG DISPLAY CO., LTD., Seoul (KR)

(72) Inventors: MyungHo Ban, Paju-si (KR); Subin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/560,660

(22) Filed: Dec. 23, 2021

(65) Prior Publication Data

US 2022/0208082 A1    Jun. 30, 2022

(30) Foreign Application Priority Data

Dec. 31, 2020    (KR) .................. 10-2020-0190028

(51) Int. Cl.
   *G09G 3/32*    (2016.01)
(52) U.S. Cl.
   CPC ......... *G09G 3/32* (2013.01); *G09G 2300/043* (2013.01); *G09G 2300/0842* (2013.01); *G09G 2310/0286* (2013.01); *G09G 2310/08* (2013.01); *G09G 2320/045* (2013.01)
(58) Field of Classification Search
   CPC ..... G09G 3/32–3291; G09G 2300/043; G09G 2300/0842; G09G 2310/0202; G09G 2310/0243; G09G 2310/0264; G09G 2310/0267; G09G 2310/0286; G09G 2310/06; G09G 2310/08; G09G 2320/02; G09G 2320/0223; G09G 2320/0233; G09G 2320/0238; G09G 2320/0242; G09G 2320/04; G09G 2320/041; G09G 2320/043–046; G09G 2330/045; G09G 2330/12; G09G 2360/16; G09G 2310/04
   See application file for complete search history.

(56) References Cited

U.S. PATENT DOCUMENTS

| | | | | |
|---|---|---|---|---|
| 2014/0085285 A1* | 3/2014 | Kim | .................. | G11C 19/28 377/67 |
| 2014/0091997 A1* | 4/2014 | Han | .................. | G09G 3/3677 377/64 |
| 2014/0376682 A1* | 12/2014 | Jang | .................. | G11C 19/28 377/64 |
| 2017/0301279 A1* | 10/2017 | Lee | .................. | G09G 3/3266 |
| 2020/0027516 A1* | 1/2020 | Feng | .................. | G09G 3/3291 |

* cited by examiner

*Primary Examiner* — Nathan Danielsen
(74) *Attorney, Agent, or Firm* — Polsinelli PC

(57) ABSTRACT

A light emitting display apparatus, which can sense a characteristic change of a transistor provided in a stage and supply a driving voltage, and which can compensate for the characteristic change, includes stages for supplying gate signals to gate lines provided in the light emitting display panel, and a controller for controlling a magnitude of a driving voltage to be transmitted to the stages by using sensing data received from the stages.

13 Claims, 9 Drawing Sheets

LIGHT EMITTING DISPLAY APPARATUS FOR SENSING CHARACTERISTIC CHANGE OF TRANSISTOR IN GATE DRIVER

CROSS-REFERENCE TO RELATED APPLICATION

This application claims the priority of the Korean Patent Application No. 10-2020-0190028, filed on Dec. 31, 2020, which is hereby incorporated by reference in its entirety.

BACKGROUND

Field of the Disclosure

The present disclosure relates to a light emitting display apparatus.

Description of the Background

A light emitting display apparatus is a display apparatus for outputting light by using a light emitting element.

A gate driver constituting the light emitting display apparatus sequentially outputs gate pulses to gate lines. To this end, the gate driver includes stages comprised of transistors.

When the light emitting display apparatus is used for a long time, characteristics of transistors constituting the stage may be changed, whereby an abnormal gate pulse may be output to the gate line.

SUMMARY

The present disclosure has been made in view of the above problems and is to provide a light emitting display apparatus that may sense a characteristic change of a transistor provided in a stage and supply a driving voltage, which may compensate for the characteristic change, to the stage.

In addition, additional features of the present disclosure will be clearly understood by those skilled in the art from the following description of the present disclosure.

In accordance with an aspect of the present disclosure, the above and other features can be accomplished by the provision of a light emitting display apparatus comprising stages for supplying gate signals to gate lines provided in the light emitting display panel; and a controller for controlling a magnitude of a driving voltage to be transmitted to the stages by using sensing data received from the stages, wherein an (n)th stage of the stages includes a signal output unit for outputting an (n)th gate signal to the gate line, a signal driver for driving the signal output unit, a stage selection unit for storing an (n)th carry signal output from the signal output unit in accordance with a stage selection control signal received from the controller, a transistor selection unit for transmitting a sensing driving voltage to a first terminal of a sensing transistor, which needs sensing, among transistors provided in the signal output unit or the signal driver in accordance with a storage signal stored in the stage selection unit and a transistor selection control signal received from the controller, and a sensing unit for converting a sensing signal transmitted from a second terminal of the sensing transistor into sensing data and transmitting the sensing data to the controller.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
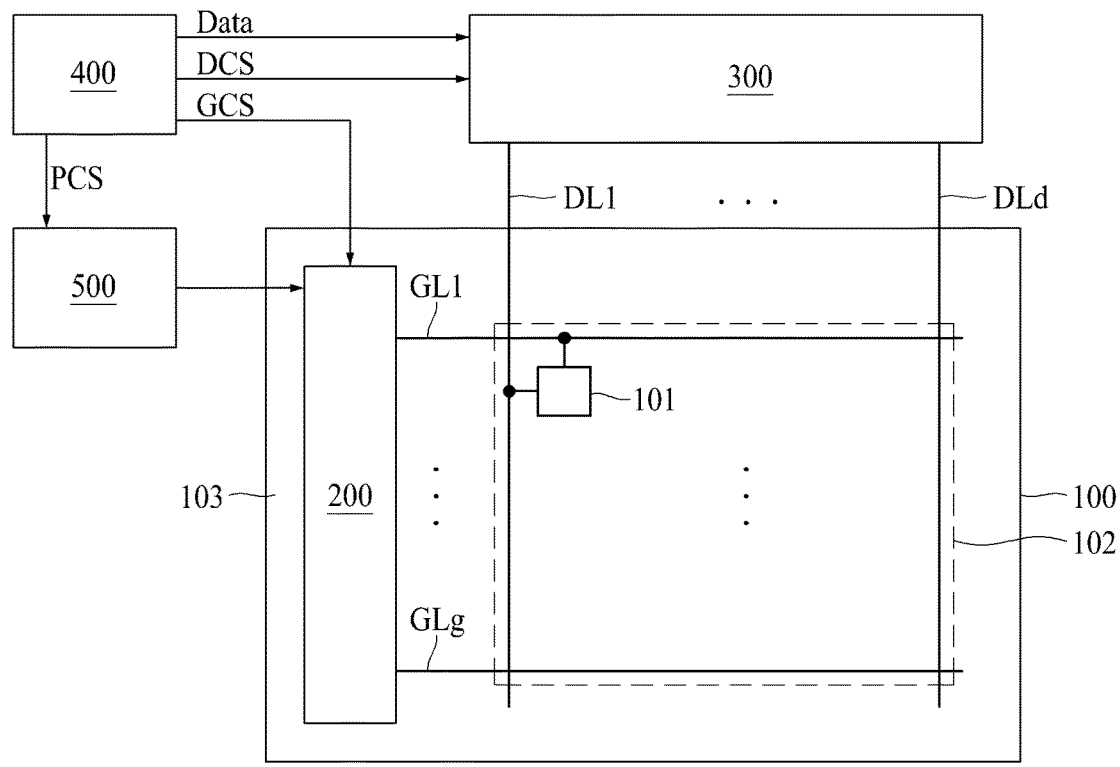
FIG. 1 is an exemplary view illustrating a structure of a light emitting display apparatus according to the present disclosure.

Advantages and features of the present disclosure and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete and will fully convey the scope of the present disclosure to those skilled in the art. Further, the present disclosure is only defined by scopes of claims.

In the drawings, the same or similar elements are denoted by the same reference numerals even though they are depicted in different drawings. Wherever possible, the same reference numbers will be used throughout the drawings to refer to the same or like parts.

A shape, a size, a ratio, an angle and a number disclosed in the drawings for describing aspects of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~%', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It should be understood that the term "at least one" includes all combinations related with any one item. For example, "at least one among a first element, a second element and a third element" may include all combinations of two or more elements selected from the first, second and third elements as well as each element of the first, second and third elements.

It will be understood that, although the terms "first," "second," etc. may be used herein to describe various elements, these elements should not be limited by these terms. These terms are only used to distinguish one element from another. For example, a first element could be termed a second element and, similarly, a second element could be termed a first element, without departing from the scope of the present disclosure.

Features of various aspects of the present disclosure may be partially or overall coupled to or combined with each other and may be variously inter-operated with each other and driven technically as those skilled in the art can sufficiently understand. The aspects of the present disclosure may be carried out independently from each other or may be carried out together in co-dependent relationship.

Hereinafter, the aspect of the present disclosure will be described in detail with reference to the accompanying drawings.

Figure 2:
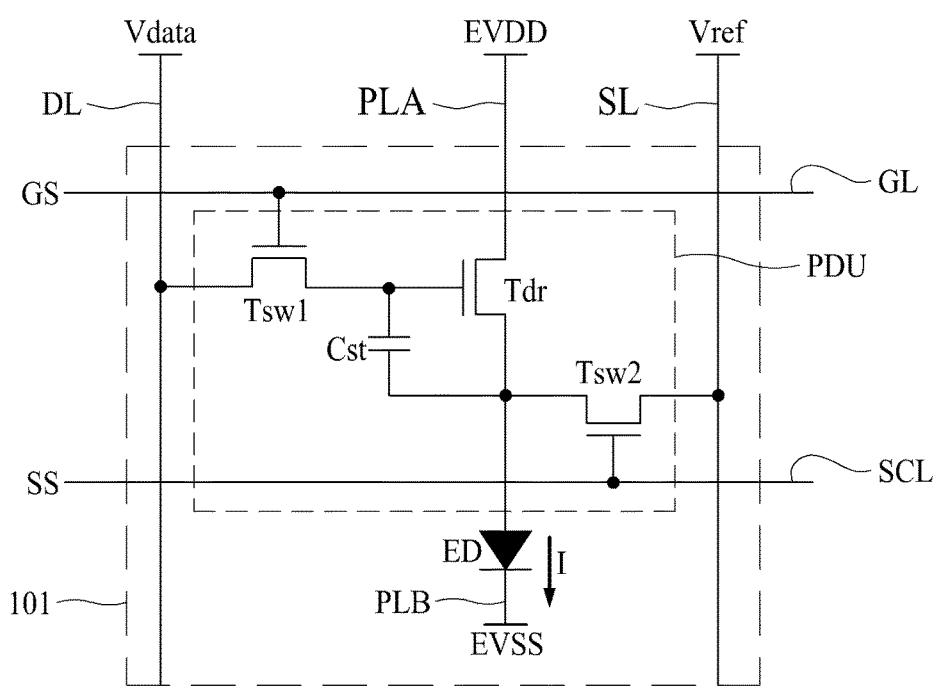
FIG. 2 is an exemplary view illustrating a structure of a pixel applied to a light emitting display apparatus according to the present disclosure.
Figure 3:
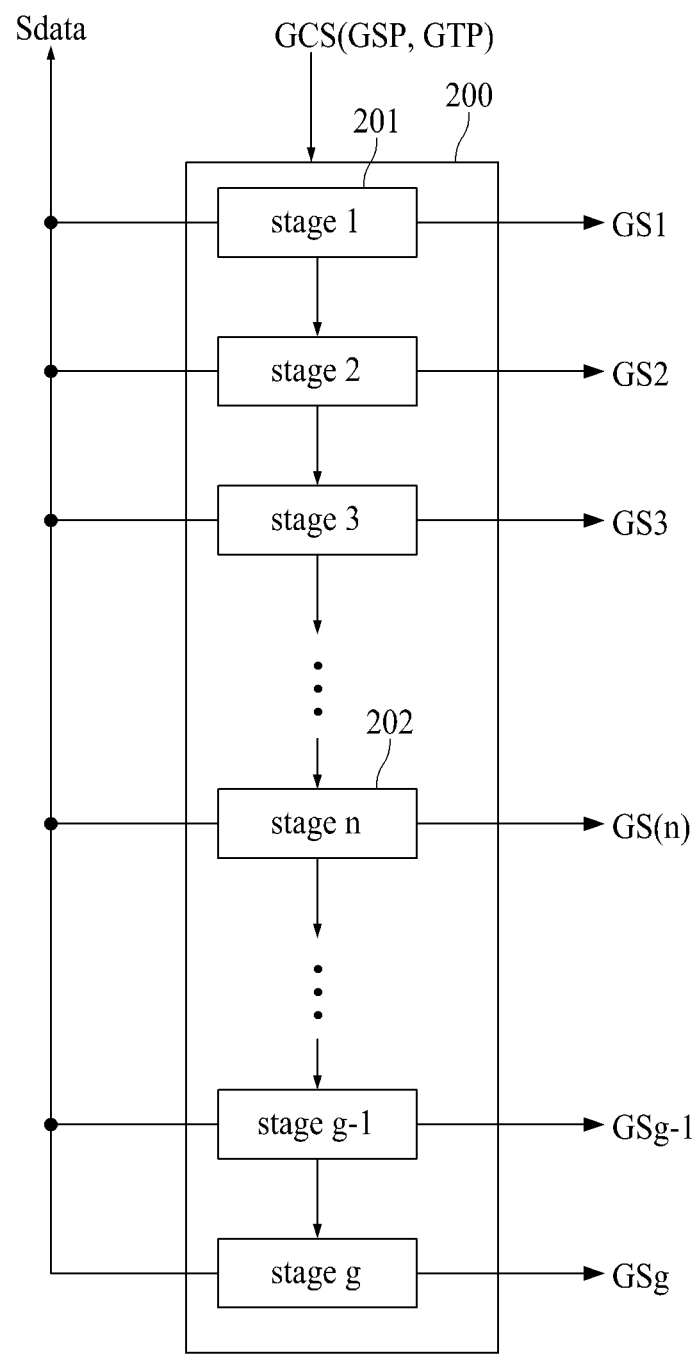
FIG. 3 is an exemplary view illustrating a configuration of a gate driver applied to a light emitting display apparatus according to the present disclosure.
Figure 4:
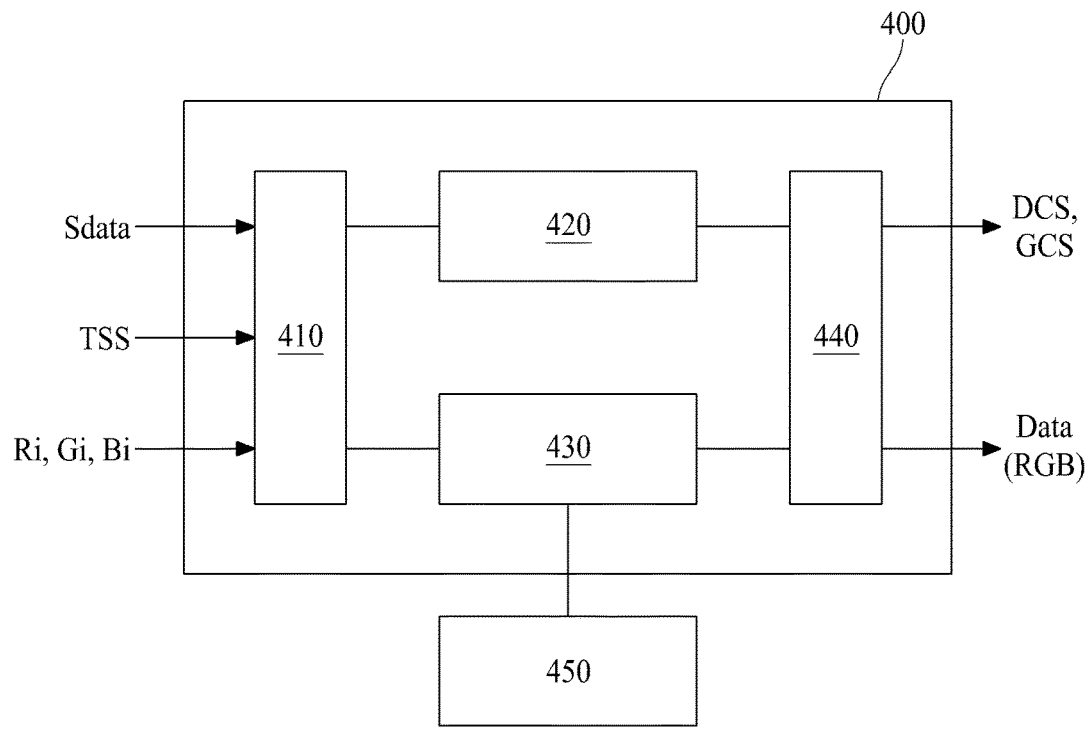
FIG. 4 is an exemplary view illustrating a configuration of a controller applied to a light emitting display apparatus according to the present disclosure.

FIG. 1 is an exemplary view illustrating a structure of a light emitting display apparatus according to the present disclosure, FIG. 2 is an exemplary view illustrating a structure of a pixel applied to a light emitting display apparatus according to the present disclosure, FIG. 3 is an exemplary view illustrating a configuration of a gate driver applied to a light emitting display apparatus according to the present disclosure, and FIG. 4 is an exemplary view illustrating a configuration of a controller applied to a light emitting display apparatus according to the present disclosure.

The light emitting display apparatus according to the present disclosure may constitute various electronic devices. The electronic device may be, for example, a smart phone, a tablet PC, a television, a monitor or the like.

As shown in FIGS. 1 to 4, the light emitting display apparatus according to the present disclosure includes a light emitting display panel 100 provided with pixels 101 connected with a gate line GL and a data line DL, a gate driver 200 including a stages 201 connected with gate lines GL1 to GLg provided in a display area 102 of the light emitting display panel 100, a data driver 300 for supplying a data voltage Vdata to the data line DL, a voltage supply unit 500 for supplying a voltage required for driving of the gate driver to the gate driver, and a controller 400 for controlling the gate driver 200, the data driver 300 and the voltage supply unit 500.

First of all, the light emitting display panel 100 includes the display area 102 and a non-display area 103.

The display area 102 is provided with gate lines GL1 to GLg, data lines DL1 to DLd, sensing lines SL1 to SLd and pixels 101, wherein 'g' and 'd' are natural numbers.

The gate driver 200 may be provided in the non-display area 103.

As shown in FIG. 2, the pixel 101 provided in the light emitting display panel 100 may include a light emitting element ED, a switching transistor Tsw1, a storage capacitor Cst, a driving transistor Tdr and a sensing transistor Tsw2. That is, the pixel 101 may include a pixel driving unit PDU and a light emitting unit, wherein the pixel driving unit PDU may include a switching transistor Tsw1, a capacitor Cst, a driving transistor Tdr and a sensing transistor Tsw2, and the light emitting unit may include a light emitting element ED.

Brightness of light output from the light emitting element may be controlled in accordance with a magnitude of a current I flowing in the light emitting element ED, a magnitude of the current I flowing in the light emitting element ED may be controlled by the driving transistor Tdr, and the driving transistor Tdr may be controlled by the data voltage Vdata.

The light emitting element ED may include any one of an organic light emitting layer, an inorganic light emitting layer and a quantum dot light emitting layer, or may include a deposited or mixed structure of an organic light emitting layer (or inorganic light emitting layer) and a quantum dot light emitting layer.

Also, the light emitting element ED may emit light corresponding to any one of various colors such as red, green and blue colors, or may emit white light.

The switching transistor Tsw1 constituting the pixel driving unit PDU is turned on or off by a gate signal GS supplied to the gate line GL, and the data voltage Vdata supplied through the data line DL is supplied to the driving transistor Tdr when the switching transistor Tsw1 is turned on.

A first voltage EVDD is supplied to the driving transistor Tdr and the light emitting element ED through a voltage supply line PLA, and a second voltage EVSS is supplied to the light emitting element ED through a voltage line PLB. The voltage supply line PLA and the voltage line PLB may be connected with the voltage supply unit 500 through the data driver 300 or the gate driver 200, or may directly be connected with the voltage supply unit 500.

The sensing transistor Tsw2 is turned on or off by a sensing control signal SS supplied through a sensing control line SCL, and a sensing line SL may be connected to the sensing transistor Tsw2.

A reference voltage Vref may be supplied to the pixel 101 through the sensing line SL, and a sensing signal related to a characteristic change of the driving transistor Tdr may be transmitted to the sensing line SL through the sensing transistor Tsw2.

The pixel 101 applied to the present disclosure may be formed in the structure shown in FIG. 2, but the present disclosure is not limited thereto. Therefore, the pixel applied to the present disclosure may be changed in various forms in addition to the structure shown in FIG. 2.

The data driver 300 may be provided on a chip-on film attached to the light emitting display panel 100, and may also be connected to a main substrate provided with the controller 400. In this case, lines for electrically connecting the controller 400, the data driver 300 and the light emitting display panel 100 are provided in the chip-on-film. To this end, the lines are electrically connected with pads provided in the main substrate and the light emitting display panel 100. The main substrate is electrically connected with an external substrate on which the external system is mounted.

The data driver 300 may directly be mounted on the light emitting display panel 100 and then electrically connected with the main substrate.

However, the data driver 300 may be formed as one integrated circuit together with the controller 400, wherein the integrated circuit may be provided in the chip-on film or directly mounted on the light emitting display panel 100.

The data driver 300 may receive the sensing signal related to the characteristic change of the driving transistor Tdr provided in the light emitting display panel from the light emitting display panel and transmit the sensing signal to the controller 400.

Then, the gate driver 200 may be provided as an integrated circuit and then mounted on the non-display area 103, or may directly be embedded in the non-display area 103 using a gate-in-panel (GIP) scheme. When the gate-in-panel scheme is used, the transistors constituting the gate driver 200 may be provided in the non-display area 103 through the same process as that of the transistors provided in the respective pixels 101 of the display area 102.

When the gate pulse generated by the gate driver 200 is supplied to a gate of the switching transistor Tsw1 provided in the pixel 101, the switching transistor Tsw1 is turned on. When a gate-off signal generated by the gate driver 200 is supplied to the switching transistor Tsw1, the switching transistor Tsw1 is turned off. The gate signal GS supplied to the gate line GL includes a gate pulse and a gate-off signal.

As shown in FIG. 3, the gate driver 200 includes stages 201 (stage 1 to stage g) connected with the gate lines GL1 to GLg provided in the display area 102. Gate signals GS1 to GSg are output from the stages stage 1 to stage g.

The (n)th stage 202 (stage n) among the stages 201 includes a signal output unit for outputting an (n)th gate signal GS(n) to the gate line GL, a signal driver for driving the signal output unit, a stage selection unit for storing an (n)th carry signal output from the signal output unit in accordance with a stage selection control signal GSP received from the controller 400, a transistor selection unit for transmitting a sensing driving voltage to a first terminal of a transistor (hereinafter, simply referred to as a sensing transistor), which needs sensing, among transistors provided in the signal output unit or the signal driver, in accordance with a storage signal stored in the stage selection unit and a transistor selection control signal GTP received from the controller 400, and a sensing unit for converting a sensing signal transmitted from a second terminal of the sensing transistor into sensing data Sdata and transmitting the sensing data Sdata to the controller 400, wherein 'n' is a natural number smaller than or equal to 'g'.

Hereinafter, a detailed structure and function of the stage 201 will be described in detail with reference to FIGS. 5 to 8D.

The voltage supply unit 500 generates a voltage required for the gate driver 200, the data driver 300 and the controller 400, and transmits the generated voltage to the gate driver 200, the data driver 300 and the controller 400.

In particular, the voltage supply unit 500 may change a magnitude of a driving voltage supplied to the stages 201 of the gate driver 200 in accordance with a voltage supply control signal PCS transmitted from the controller 400.

Next, as shown in FIG. 4, the controller 400 may include a data aligner 430 for realigning input image data Ri, Gi and Bi transmitted from an external system using a timing synchronization signal TSS transmitted from the external system and supplying the realigned image data Data to the data driver 300, a control signal driver 420 for generating a gate control signal GCS and a data control signal DCS using the timing synchronization signal TSS, an input unit 410 for receiving the timing synchronization signal TSS and the input image data Ri, Gi and Bi transmitted from the external system and transmitting them to the data aligner 430 and the control signal driver 420, and an output unit 440 for outputting the image data Data generated from the data aligner 430 and the control signals DCS and GCS generated from the control signal driver 420 to the data driver 300 or the gate driver 200.

The controller 400 may serve to store the sensing data Sdata transmitted from the stages 201. To this end, the controller 400 may include a storage unit 450. However, the storage unit 450 may be provided in the light emitting display apparatus as an independent element.

The control signal driver 420 may further generate a control signal (hereinafter, simply referred to as a voltage supply control signal PCS) for controlling the voltage supply unit 500.

The gate control signal GCS may include the stage selection control signal GSP supplied to the stage selection unit and the transistor selection control signal GTP supplied to the transistor selection unit.

Finally, the external system serves to drive the controller 400 and the electronic device. That is, when the electronic device is a smart phone, the external system receives various kinds of voice information, image information and text information through a wireless communication network and transmits the received image information to the controller 400. The image information may be the input image data Ri, Gi and Bi.

Figure 5:
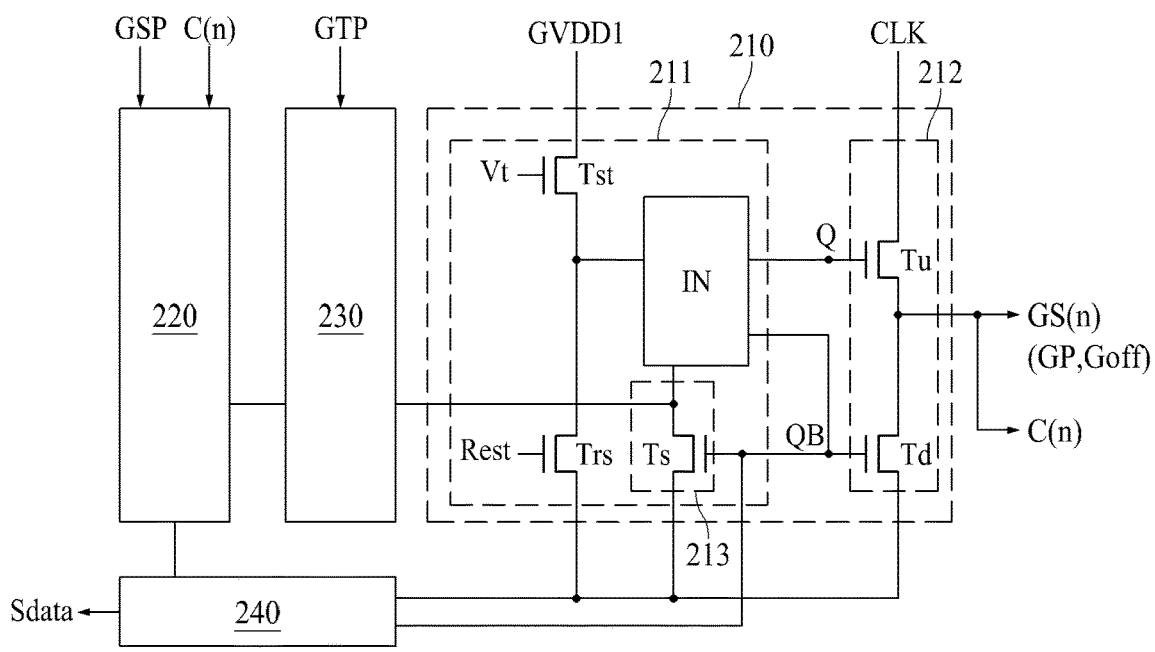
FIG. 5 is a schematic exemplary view illustrating a configuration of an (n)th stage of stages shown in FIG. 3.
Figure 6:
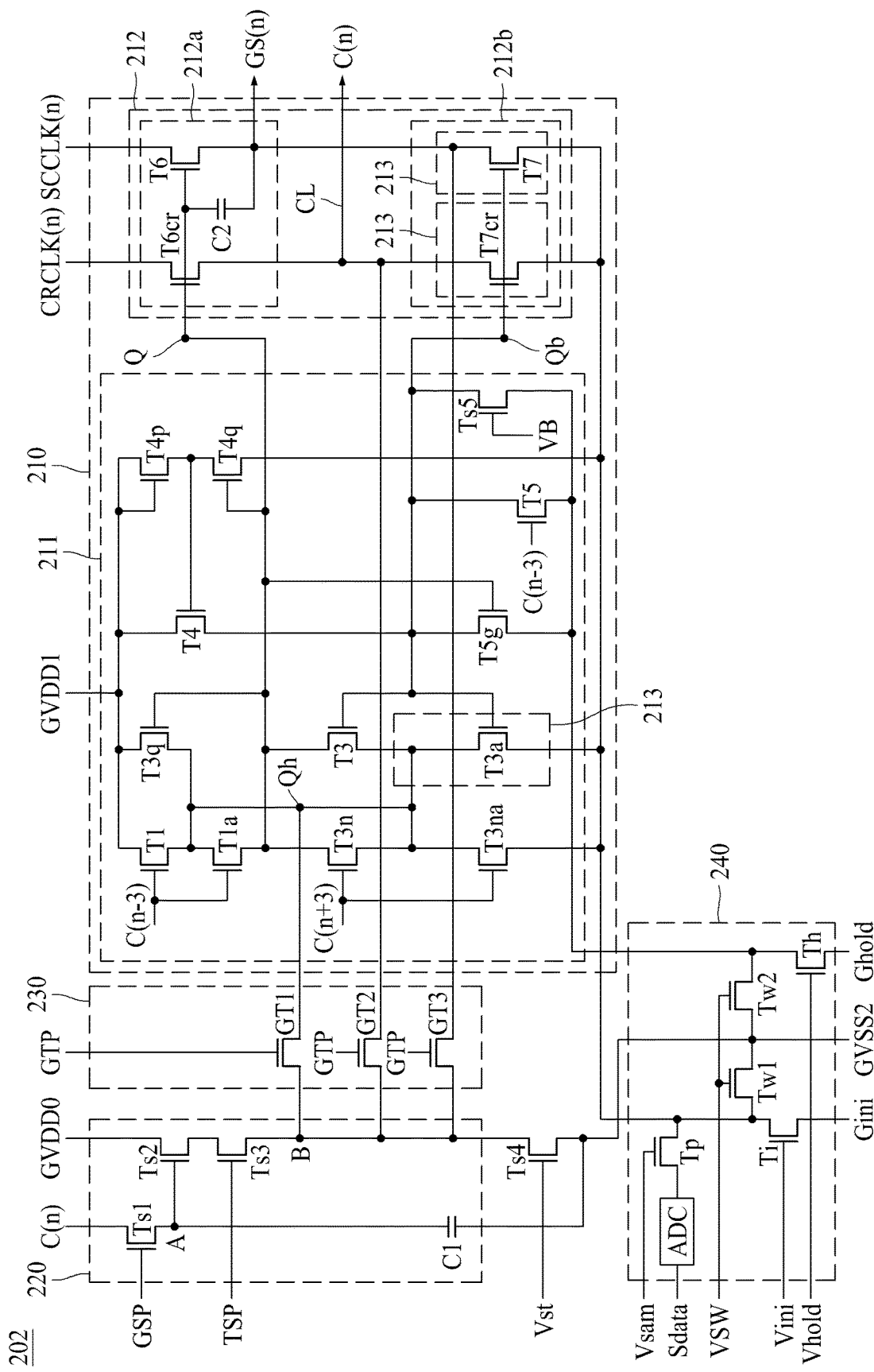
FIG. 6 is a detailed exemplary view illustrating a configuration of an (n)th stage shown in FIG. 5.

FIG. 5 is a schematic exemplary view illustrating a configuration of an (n)th stage of stages shown in FIG. 3, and FIG. 6 is a detailed exemplary view illustrating a configuration of an (n)th stage shown in FIG. 5.

As described above, the gate driver 200 includes stages 201 (stage 1 to stage g) connected with the gate lines GL1 to GLg provided in the display area 102.

Each of the stages 201 may output the gate signal GS to the gate line GL. The gate signal GS includes a gate pulse GP capable of turning on the switching transistor Tsw1 connected to the gate line GL, and a gate-off signal Goff capable of turning off the switching transistor Tsw1.

Hereinafter, the present disclosure will be described using the (n)th stage 202 of the stages shown in FIG. 3. Therefore, the structure and function of the (n)th stage 202 described below may commonly be applied to the other stages 201.

In this case, the stage 201 applied to the present disclosure is not limited to the (n)th stage 202 shown in FIG. 6. That is, the stages 201 applied to the present disclosure have a basic structure as shown in FIG. 5, and may be formed, for example, in a structure as shown in FIG. 6. However, the stage 201 applied to the present disclosure may have a structure different from that shown in FIG. 6.

The (n)th stage 202 of the stages provided in the gate driver 200, as shown in FIGS. 5 and 6, includes a signal output unit 212 for outputting an (n)th gate signal GS(n) to the gate line GL, a signal driver 211 for driving the signal output unit 212, a stage selection unit 220 for storing an (n)th carry signal C(n) output from the signal output unit in accordance with a stage selection control signal GSP received from the controller 400, a transistor selection unit 230 for transmitting a sensing driving voltage GVDD0 to a first terminal of the sensing transistor 213, which needs sensing, among transistors provided in the signal output unit 212 or the signal driver 211 in accordance with a storage signal stored in the stage selection unit 220 and a transistor selection control signal GTP received from the controller 400, and a sensing unit 240 for converting a sensing signal transmitted from a second terminal of the sensing transistor 213 into sensing data Sdata and transmitting the sensing data Sdata to the controller 400.

The signal output unit 212 and the signal driver 211 are included in a basic driving unit 210. The basic driving unit 210 serves to perform a basic function of the (n)th stage 202, that is, output the (n)th gate signal GS(n). Therefore, the structure of the signal output unit 212 and the signal driver 211 may be changed to various structures capable of outputting the (n)th gate signal GS(n).

As shown in FIG. 6, the first terminal of the sensing transistor 213 is connected with the transistor selection unit 230 through a Qh node Qh, the second terminal of the sensing transistor 213 is connected with the sensing unit 240, and the gate of the sensing transistor 213 is connected to a QB node QB. In accordance with a QB signal supplied to the QB node QB, the signal output unit 212 may output the gate-off signal Goff to the gate line GL.

In this case, as shown in FIG. 5, the sensing transistor 213 may be a transistor provided in the signal driver 211, and may be a transistor provided in the signal output unit 212, as shown in FIG. 6.

That is, in the following description, the sensing transistor 213 may be a transistor, in which degradation occurs severely when compared to other transistors, among transistors provided in the signal output unit 212 and the signal driver 211.

For example, a (3a)th transistor T3a provided in the signal driver 211 shown in FIG. 6, a (7cr)th transistor T7cr provided in the signal output unit 212 shown in FIG. 6 and the seventh transistor T7 provided in the signal output unit 212 shown in FIG. 6 are transistors for supplying the gate-off signal Goff. Therefore, these transistors should be maintained at a turn-on state for most of one frame period that includes a display period and a blank period. As a result, the (3a)th transistor T3a, the (7cr)th transistor T7cr and the seventh transistor T7 are likely to be degraded when compared to the other transistors provided in the (n)th stage 202.

Therefore, in the (n)th stage 202 shown in FIG. 6, each of the (3a)th transistor T3a, the (7cr)th transistor T7cr and the seventh transistor T7 may be a sensing transistor 213.

As described above, the sensing transistor 213 is characterized in that its first terminal is connected with the transistor selection unit 230, its second terminal of the sensing transistor 213 is connected with the sensing unit 240 and its gate is connected to the QB node QB.

Therefore, the sensing transistor 213 is turned on by a signal applied to the QB node QB during the sensing period. When the sensing transistor 213 is turned on, the sensing signal is induced to the second terminal by the sensing driving voltage GVDD0 supplied to the first terminal, and the threshold voltage of the sensing transistor 213 may be determined by the sensing signal transmitted to the sensing unit 240 through the second terminal.

Next, the stage selection unit 220 performs a function of storing the (n)th carry signal C(n) output from the signal output unit 212 in accordance with the stage selection control signal GSP received from the controller 400.

To this end, the stage selection unit 220 includes a stage selection transistor Ts1, a carry signal storage capacitor C1, a storage signal transistor Ts2 and a sensing driving voltage transistor Ts3, as shown in FIG. 6.

The stage selection transistor Ts1 includes a first terminal to which the (n)th carry signal C(n) is supplied, a gate to which the stage selection control signal GSP is supplied, and a second terminal. The second terminal may be an A node A. The carry signal storage capacitor C1 is connected between a second terminal of the stage selection transistor Ts1 and the sensing unit 240. That is, a first terminal of the carry signal storage capacitor C1 is connected to the second terminal of the stage selection transistor Ts1, and a second terminal of the carry signal storage capacitor C1 is connected to the sensing unit 240. The storage signal transistor Ts2 includes a gate to which the storage signal stored in the carry signal storage capacitor C1 is supplied, a first terminal to which the sensing driving voltage GVDD0 is supplied, and a second terminal different from the first terminal. The storage signal means a voltage stored in the carry signal storage capacitor C1 by the (n)th carry signal C(n). That is, the storage signal means a voltage VA of the A node A. The sensing driving voltage transistor Ts3 includes a gate to which the timing selection control signal TSP is supplied, a first terminal connected with a second terminal of the storage signal transistor Ts2, and a second terminal connected with the transistor selection unit 230. The second terminal of the sensing driving voltage transistor Ts3 may be a B node B.

The stage selection unit 220 may further include a voltage sustain transistor Ts4 that includes a first terminal connected with the transistor selection unit 230, a second terminal connected with the sensing unit 240 and a gate to which a turn-off control signal Vst is supplied.

The (n)th carry signal C(n) is output from the signal output unit 212 of the (n)th stage 202. The (n)th carry signal C(n) may be a gate pulse included in the (n)th gate signal GS(n) output from the signal output unit 212, but may be a signal independent of the gate pulse. That is, as shown in FIG. 6, the signal output unit 212 of the (n)th stage 202 may simultaneously output the (n)th gate signal GS(n) and the (n)th carry signal C(n).

When the stage selection transistor Ts1 is turned on by the stage selection control signal GSP, the (n)th carry signal C(n) is supplied to the second terminal of the stage selection transistor Ts1, that is, the A node A. Since the carry signal storage capacitor C1 is provided in the A node A, the storage signal corresponding to the (n)th carry signal C(n) is charged in the A node A.

When the storage signal charged in the A node A is supplied to the storage signal transistor Ts2, the storage signal transistor Ts2 may be turned on.

When the storage signal transistor Ts2 is turned on, the sensing driving voltage transistor Ts3 is turned on by the timing selection control signal TSP and the sensing driving voltage GVDD0 is supplied to the B node B through the storage signal transistor Ts2 and the sensing driving voltage transistor Ts3. The B node B is connected with the transistor selection unit 230.

When the sensing driving voltage GVDD0 is supplied to the B node B, since the voltage sustain transistor Ts4 is turned off, the sensing driving voltage GVDD0 may be charged in the B node B.

The second terminal of the voltage sustain transistor Ts4 and the second terminal of the carry signal storage capacitor C1 are connected to the sensing unit 240.

Next, in accordance with the storage signal stored in the stage selection unit 220 and the transistor selection control signal GTP received from the controller, the transistor selection unit 230 transmits the sensing driving voltage GVDD0 to the first terminal of the sensing transistor 213, which needs sensing, among the transistors provided in the signal output unit 212 or the signal driver 211.

To this end, the transistor selection unit 230 includes at least one selection transistor GT. In FIG. 6, a transistor selection unit 230 provided with three selection transistors GT1, GT2 and GT3 is illustrated as an example of the present disclosure.

Each of the selection transistors GT1, GT2 and GT3 includes a first terminal connected with the stage selection unit 220, a gate to which the transistor selection control signal GTP is supplied, and a second terminal connected with the sensing transistor 213.

For example, as shown in FIG. 6, when the three selection transistors GT1, GT2 and GT3 and the three sensing transistors 213 are provided, the threshold voltage of the sensing transistor 213 connected with the selection transistor turned on by the transistor selection control signal GTP may be sensed.

Next, the signal output unit 212 serves to output the (n)th gate signal GS(n) to the gate line GL.

To this end, as shown in FIG. 5, the signal output unit 212 may include a pull-up transistor Tu for outputting the gate pulse GP output to the gate line GL, and a pull-down transistor Td for outputting the gate-off signal Goff output to the gate line GL. In this case, the gate pulse GP may be the (n)th carry signal C(n), and the (n)th carry signal C(n) may be supplied to the stage selection unit 220.

However, as shown in FIG. 6, the signal output unit 212 may include a gate pulse output unit 212a for outputting the gate pulse GP and the (n)th carry signal C(n) in accordance with a Q node signal supplied to a Q node Q, and a gate-off signal output unit 212b for outputting the gate-off signal Goff in accordance with a QB node signal having a phase opposite to that of the Q node signal.

The gate pulse output unit 212a includes a carry transistor T6cr for outputting the (n)th carry signal C(n) in accordance with the Q node signal and a gate pulse transistor T6 for outputting the gate pulse GP in accordance with the Q node signal.

A gate of the carry transistor T6cr and a gate of the gate pulse transistor T6 are connected to the Q node Q.

A carry clock CRCLK(n) is supplied to a first terminal of the carry transistor T6cr, and a gate clock SCCLK(n) is supplied to a first terminal of the gate pulse transistor T6.

A second terminal of the carry transistor T6cr is connected with an output line CL through which the (n)th carry signal C(n) is output, and a second terminal of the gate pulse transistor T6 is connected with the gate line GL.

That is, the carry transistor T6cr is turned on in accordance with the Q node signal, and outputs the (n)th carry signal C(n) by using the carry clock CRCLK(n). The gate pulse transistor T6 is turned on in accordance with the Q node signal, and outputs the gate pulse GP by using the gate clock SCCLK(n).

A capacitor C2 is connected between the gate of the gate pulse transistor T6 and the gate line. The capacitor C2 serves to uniformly maintain a voltage between the gate of the gate pulse transistor T6 and the gate line.

The gate-off signal output unit 212b includes a carry-off signal transistor T7cr including a first terminal connected with the carry signal output line CL to which the (n)th carry signal C(n) is output, a second terminal connected with the sensing unit 240 and a gate connected with the QB node QB to receive the QB node signal, and a gate-off signal transistor T7 including a first terminal connected with the gate line GL to which the gate pulse GP is output, a second terminal connected with the sensing unit 240, and a gate connected with the QB node QB to receive the QB node signal.

The gate of the carry-off signal transistor T7cr and the gate of the gate-off signal transistor T7 are connected with the QB node QB. The QB signal supplied to the QB node QB has a phase opposite to that of the Q node signal supplied to the Q node Q.

The first terminal of the carry-off signal transistor T7cr is connected with the output line CL, and the first terminal of the gate-off signal transistor T7 is connected with the gate line GL.

The second terminal of the carry-off signal transistor T7cr and the second terminal of the gate-off signal transistor T7 are connected with the sensing unit 240.

That is, the carry-off signal transistor T7cr is turned on in accordance with the QB node signal, and outputs a carry-off signal by using the signal supplied from the sensing unit 240. Also, the gate-off signal transistor T7 is turned on in accordance with the QB node signal, and outputs the gate-off signal Goff by using the signal supplied from the sensing unit 240.

In this case, at least one of the carry-off signal transistor T7cr or the gate-off signal transistor T7 may be the sensing transistor 213.

That is, as described above, the sensing transistor 213 is characterized in that its first terminal is connected with the transistor selection unit 230, its second terminal is connected with the sensing unit 240 and its gate is connected to the QB node QB. The carry-off signal transistor T7cr and the gate-off signal transistor T7 have the characteristics described as above. Therefore, each of the carry-off signal transistor T7cr and the gate-off signal transistor T7 may be the sensing transistor 213.

Next, the signal driver 211 may include a plurality of transistors to generate a Q node signal supplied to the Q node Q and a QB node signal supplied to the QB node QB. A signal driver 211 including three transistors Tst, Trs and Ts and an inverter IN is shown in FIG. 5 to describe a basic structure and a basic function of the signal driver 211 applied to the present disclosure. That is, the signal driver 211 shown in FIG. 5 is schematically illustrated as an example of a signal driver applied to the present disclosure.

The start transistor Tst is turned on by a start signal Vt, and supplies a high voltage GVDD1 to the signal output unit 210 through the Q node Q. In this case, the start signal Vt may be a gate start signal transmitted from the controller 400, or may be a gate pulse GP transmitted from a previous stage, or may be a carry signal transmitted from the previous stage. The gate pulse GP may be output from the signal output unit 212 by the high voltage GVDD1 transmitted to the Q node. Therefore, the high voltage GVDD1 transmitted to the Q node may be a Q node signal QS. That is, the signal transmitted to the Q node may be the Q node signal QS.

The high voltage GVDD1 that has passed through the start transistor Tst may be converted into a low voltage by the inverter IN and transmitted to the QB node QB. Due to the low voltage transmitted to the QB node QB, the gate-off signal is not output from the signal output unit 212. However, the inverter IN may convert another voltage other than the high voltage GVDD1 into a low voltage and transmit the low voltage to the QB node QB, or may transmit the low voltage applied from the sensing unit 240 to the QB node QB. The low voltage transmitted to the QB node QB may be a QB node signal.

That is, the inverter IN may transmit the high voltage GVDD1 to the Q node Q, and may transmit a low voltage having a phase opposite to that of the high voltage GVDD1 to the QB node QB. In addition, the inverter IN may transmit the low voltage supplied from the sensing unit 240 to the Q node Q, and may transmit a high voltage having a phase opposite to that of the low voltage to the QB node QB.

For example, when the start transistor Tst is turned off and the reset transistor Trs is turned on by a reset signal Rest, a second low voltage may be supplied to the Q node Q through the reset transistor Trs. In this case, the second low voltage may be converted into a high voltage by the inverter IN and then supplied to the QB node QB.

As described above, the sensing transistor 213 shown in FIG. 5 may be one of various transistors constituting the signal driver 211. The sensing transistor 213 may be connected with various transistors constituting the signal driver 211 in various forms.

In this case, the sensing transistor 213 provided in the signal driver 211 also has the characteristics of the sensing transistor 213, which are described as above. That is, the first terminal of the sensing transistor 213 shown in FIG. 5 is connected with the transistor selection unit 230, its second terminal is connected with the sensing unit 240, and its gate is connected to the QB node QB.

In order to perform the function described above, the signal driver 211 may include a basic structure as shown in FIG. 5. However, various modifications may be made in the structure and function of the signal driver 211 in addition to the structure and function described with reference to FIG. 5.

That is, the signal driver 211 may be configured as shown in FIG. 6. Since the feature of the present disclosure is not in the structure of the signal driver 211, the signal driver 211 shown in FIG. 6 will briefly be described.

For example, transistors marked with reference numerals T1 and T1a in the signal driver 211 shown in FIG. 6 may correspond to the start transistor Tst described with reference to FIG. 5. In this case, the high voltage GVDD1 supplied to the start transistor Tst may be supplied to the Q node Q, and therefore the high voltage GVDD1 may be a Q node signal. The start signal supplied to a gate of each of the start transistors T1 and T1a shown in FIG. 6 may be a (n−3)th carry signal C(n−3) output from a (n−3)th stage.

Also, transistors marked with reference numerals T3n and T3na in the signal driver 211 shown in FIG. 6 may correspond to the reset transistor Trs described with reference to FIG. 5. The reset signal supplied to the gate of the reset transistors T3n and T3na shown in FIG. 6 may be a (n+3)th carry signal C(n+3) output from a (n+3)th stage.

In addition, the sensing transistor 213 provided in the signal driver 211 shown in FIG. 6 may serve to supply a second low voltage GVSS2 supplied from the sensing unit 240 to the Q node Q, and a carry transistor T6a and a gate pulse transistor T6 may be turned off by the second low voltage GVSS2. Since structures and functions of the other transistors shown in FIG. 6 are not directly related to the present disclosure, their detailed description will be omitted.

That is, the signal driver 211 may be changed to various forms including the basic structure shown in FIG. 5, and may be formed, for example, in the structure shown in FIG. 6. In addition, in accordance with the Q node signal and the QB node signal, which are generated by the signal driver 211, the signal output unit 212 may output the gate pulse, the (n)th carry signal C(n), the gate-off signal Goff and the carry-off signal.

In this case, at least one of the signal driver 211 or the signal output unit 212 may include at least one sensing transistor 213.

For example, the (3a)th transistor of the transistors provided in the signal driver 211 shown in FIG. 6 may be the sensing transistor, and the carry-off signal transistor T7cr and the gate-off signal transistor T7 of the transistors provided in the signal output unit 212 shown in FIG. 6 may be the sensing transistors.

That is, since the first terminals of the (3a)th transistor T3a, the carry-off signal transistor T7cr and the gate-off signal transistor T7 are connected with the transistor selection unit 230, their second terminals are connected with the sensing unit 240 and their gates are connected to the QB node QB, the (3a)th transistor T3a, the carry-off signal transistor T7cr and the gate-off signal transistor T7 may be the sensing transistors 213.

Finally, the sensing unit 240 converts the sensing signal transmitted from the second terminal of the sensing transistor 213 into sensing data Sdata and transmits the sensing data Sdata to the controller 400.

The sensing unit 240 senses a change amount of the threshold voltage of the sensing transistor 213 during a blank period between display periods for outputting an image from the light emitting display panel 100, thereby generating the sensing data Sdata.

In this case, a black image from the light emitting display panel 100 is output during the display period until a first period passes after the light emitting display panel 100 is driven. When the first period passes, an image corresponding to the input image data supplied from the external system is output from the light emitting display panel 100 during the display period.

That is, until the first period passes after the light emitting display apparatus is turned on, the light emitting display apparatus outputs the black image to the light emitting display panel 100 every display period of one frame period. One frame period includes a display period at which gate pulses are supplied to the gate lines to output one image from the light emitting display panel 100 and a blank period at which the gate pulses are not supplied to the gate lines. In addition, the light emitting display apparatus outputs a black image to the light emitting display panel 100 every one frame period until the first period passes after the light emitting display apparatus is turned on, and the light emitting display apparatus performs preparation processes for outputting an image while the black image is being output.

When the first period passes, the light emitting display apparatus outputs an image corresponding to the input image data supplied from the outside to the light emitting display panel 100.

The display apparatus according to the present disclosure senses the change amount of the threshold voltage of the sensing transistor 213 during a blank period of the first period, thereby generating sensing data Sdata.

For example, when the black image is output six times during the first period, one frame period of six times passes, and thus blank periods of six times occur. Therefore, six sensing transistors 213 provided in six stages 201 may be sensed.

However, as shown in FIG. 6, when three sensing transistors 213 are provided in one stage, six sensing transistors 213 provided in two stages 201 may be sensed during six blank periods.

That is, one sensing transistor 213 may be sensed during one blank period.

Also, the light emitting display apparatus may sense the sensing transistor 213 when the light emitting display apparatus is turned off.

That is, even though the light emitting display apparatus is turned off, the light emitting display apparatus may internally perform various functions. In this case, a black image may be output to the light emitting display panel 100. Therefore, the light emitting display apparatus may sense the sensing transistor 213 during a blank period while the black image is being output.

In order to perform the functions described above, the sensing unit 240, as shown in FIG. 6, includes an initialization transistor Ti for initializing the second terminal of the sensing transistor 213, a hold transistor Th for supplying a hold voltage Ghold capable of turning on the sensing transistor 213, to the gate of the sensing transistor 213, a converter ADC for converting a sensing signal into sensing data Sdata, and a sampling transistor Tp for transmitting the sensing signal transmitted from the second terminal of the sensing transistor 213 to the converter ADC. In this case, the gate of the sensing transistor 213 is the QB node QB.

The initialization transistor Ti includes a first terminal connected with the second terminal of the sensing transistor 213, a gate to which a sensing initialization control signal Vini is supplied, and a second terminal to which an initialization voltage Gini to be supplied to the second terminal of the sensing transistor 213 is supplied.

The hold transistor Th includes a first terminal connected with the gate of the sensing transistor 213, a gate to which a hold control signal Vhold is supplied, and a second terminal to which a hold voltage Ghold capable of turning on the sensing transistor 213 is supplied. In this case, as shown in FIG. 6, the first terminal of the hold transistor Th may be connected with the gate of the sensing transistor 213 when a (s5)th transistor Ts5 is turned on. The (s5)th transistor Ts5 may be turned on in accordance with a voltage VB applied to the B node B of the stage selection unit 220. That is, the (s5)th transistor Ts5 may be turned on by the sensing driving voltage GVDD0 applied to the B node B.

The converter ADC converts the sensing signal into the sensing data Sdata, and transmits the sensing data Sdata to the controller 400. The converter may be an analog-to-digital converter.

The sampling transistor Tp includes a first terminal connected with the second terminal of the sensing transistor 213, a second terminal connected with the converter ADC, and a gate to which a sampling control signal Vsam is supplied.

In addition to the above-described elements, the sensing unit 240 may include a first low voltage transistor Tw1 and a second low voltage transistor Tw2 to transmit the second low voltage GVSS2 to the signal driver 211 and the signal output unit 212.

For example, the first low voltage transistor Tw1 includes a first terminal connected with the first terminal of the initialization transistor Ti, a gate to which a low voltage control signal Vsw is supplied, and a second terminal to which the second low voltage GVSS2 is supplied.

The second low voltage transistor Tw2 includes a first terminal connected with the second terminal of the first low voltage transistor Tw1, a gate to which the low voltage control signal Vsw is supplied, and a second terminal connected with the first terminal of the hold transistor Th.

When the first low voltage transistor Tw1 and the second low voltage transistor Tw2 are turned on by the low voltage control signal Vsw, the second low voltage GVSS2 may be supplied to the signal driver 211 and the signal output unit 212 through the first low voltage transistor Tw1 and the second low voltage transistor Tw2.

In this case, the second low voltage GVSS2 may also be supplied to the voltage sustain transistor Ts4 provided in the stage selection unit 220.

Hereinafter, a method of driving the display apparatus according to the present disclosure will be described with reference to FIGS. 1 to 8D. In the following description, elements the same as or similar to those described with reference to FIGS. 1 to 6 will be omitted or briefly described.

Figure 7:
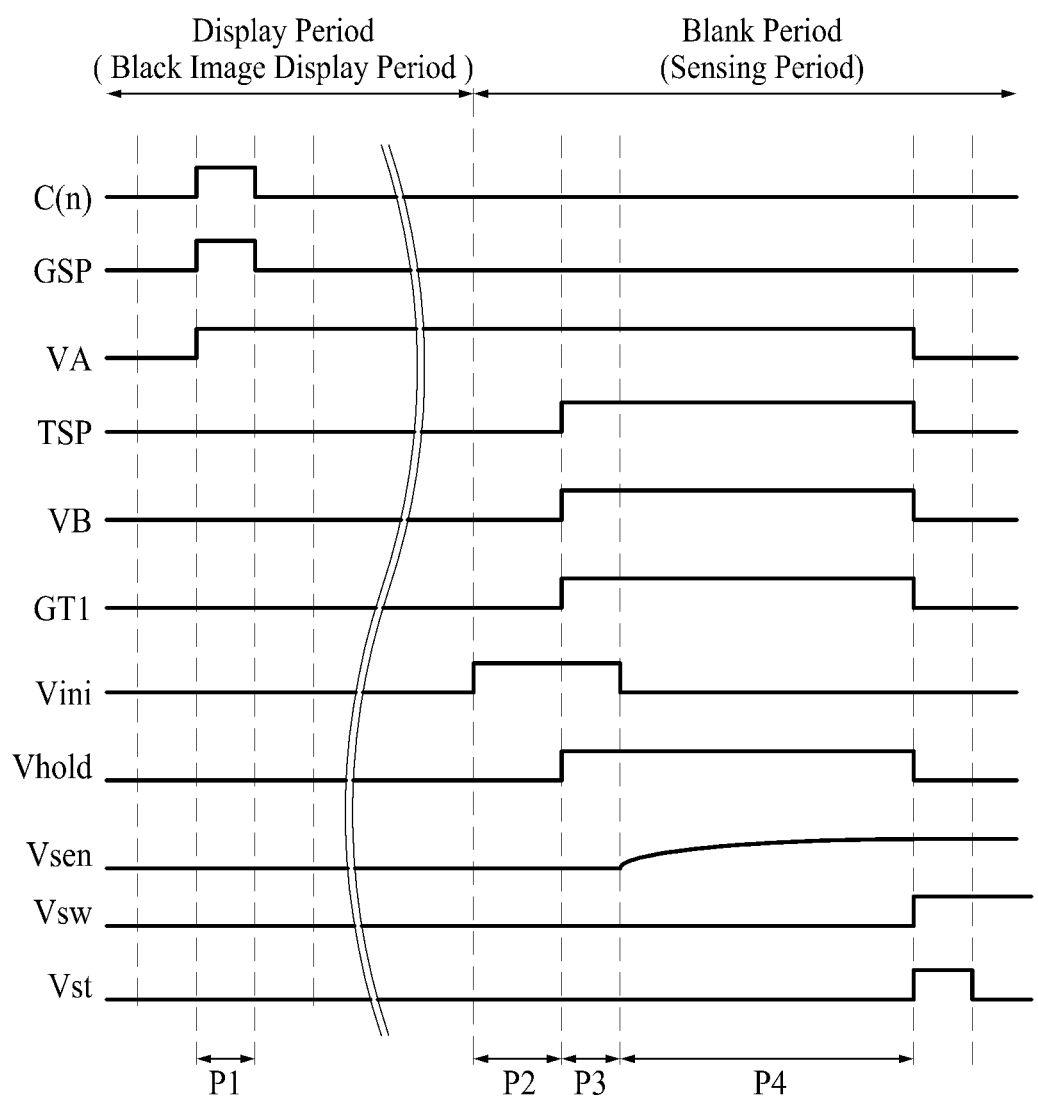
FIG. 7 is a waveform illustrating signals applied to a light emitting display apparatus according to the present disclosure.

FIG. 7 is a waveform illustrating signals applied to a light emitting display apparatus according to the present disclosure, and FIGS. 8A to 8D are exemplary views illustrating a method of sensing a sensing transistor in a light emitting display apparatus according to the present disclosure. Hereinafter, a method of sensing the sensing transistor 213 provided in the signal driver 211 shown in FIG. 6, that is, the (3a)th transistor T3a will be described as an example of the present disclosure.

When the light emitting display apparatus is turned on, the light emitting display apparatus outputs a black image through the light emitting display panel 100. While the black image is being output, the light emitting display apparatus performs functions for normally outputting an image. For example, the light emitting display apparatus may synchronize a timing at which the data voltage Vdata is output to the data line DL with a timing at which the gate pulse GP is output to the gate line GL, and may synchronize various signals to be used in the data driver 300 and the gate driver 200.

Since the black image is one of the images output from the light emitting display panel 100, a period at which the black image is output from the light emitting display panel 100 is a display period, and a period at which the black image is not output is a blank period. The display period and the blank period form one frame period.

In particular, as described above, until a first period passes after the light emitting display apparatus is turned on, the black image is output at the display period, and the threshold voltage of the sensing transistor 213 may be sensed at the blank period.

The display period included in the first period may be referred to as a black image display period, and a blank period may be referred to as a sensing period. Hereinafter, a method of driving a light emitting display apparatus at a first period will be described. Therefore, for convenience of description, the display period will be referred to as a black image display period, and the blank period will be referred to as a sensing period.

First of all, the black image is output at the black image display period.

Figure 8A:
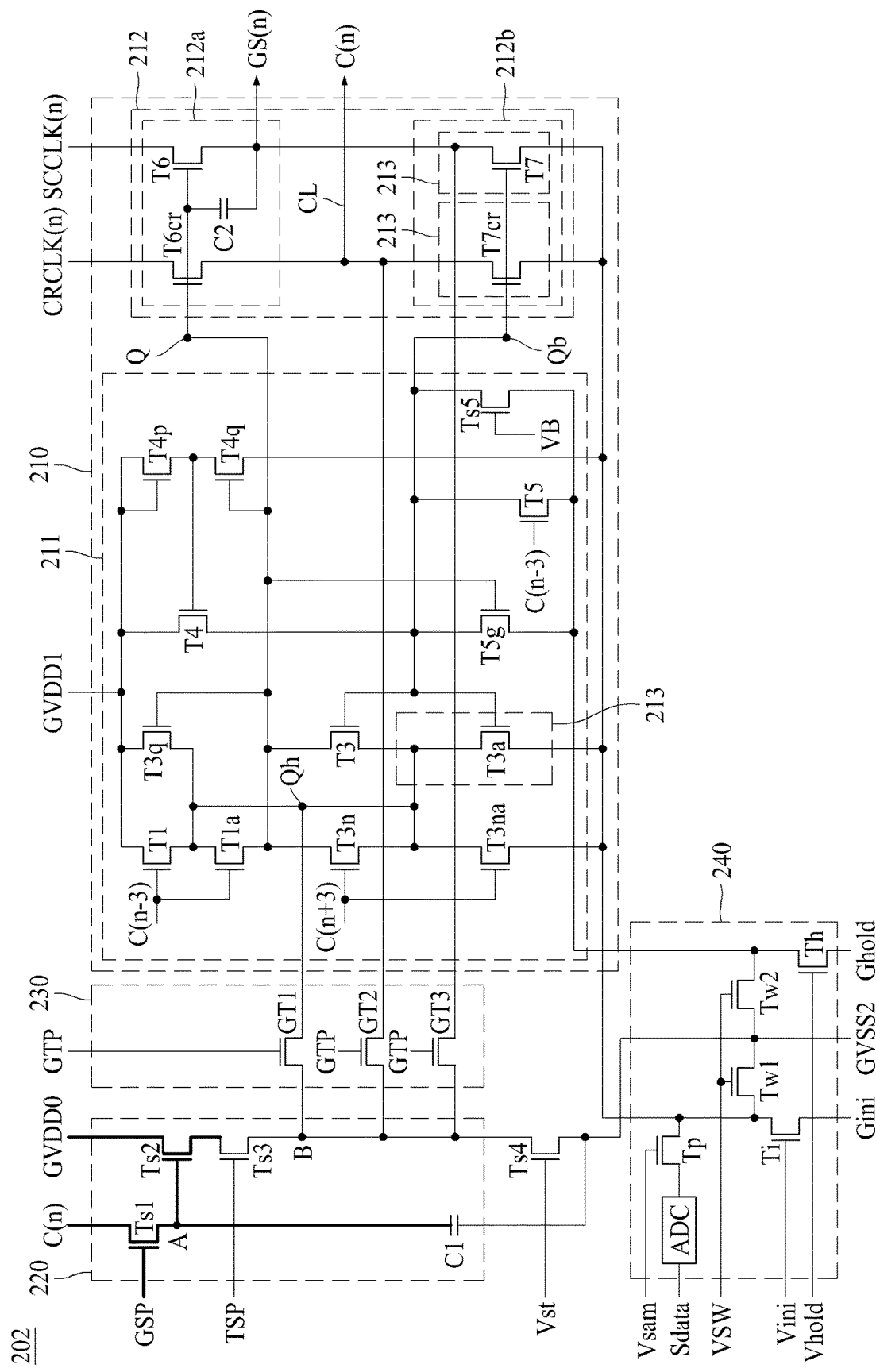
FIGS. 8A to 8D are exemplary views illustrating a method of sensing a sensing transistor in a light emitting display apparatus according to the present disclosure.

Next, referring to FIGS. 7 and 8A, the controller 400 transmits the stage selection control signal GSP to the gate driver 200 at a stage selection period P1 of the black image display period.

For example, the controller 400 transmits the stage selection control signal GSP to the gate driver 200 at a period at which the (n)th carry signal C(n) and the gate pulse GP are output from the (n)th stage 202.

That is, when the sensing transistor 213 provided in the (n)th stage 202 is to be sensed at the sensing period, the controller 400 transmits the stage selection control signal GSP to the gate driver 200 at a period at which the (n)th carry signal C(n) and the gate pulse GP are output from the (n)th stage 202 during the black image display period generated before the sensing period.

The period at which the (n)th carry signal C(n) and the gate pulse GP are output from the (n)th stage 202 will be referred to as a stage selection period P1.

When the stage selection control signal GSP is supplied to the gate of the stage selection transistor Ts1 provided in the (n)th stage 202 at the stage selection period P1, as shown in FIG. 8A, the stage selection transistor Ts1 is turned on. Therefore, the (n)th carry signal C(n) is applied to the carry signal storage capacitor C1. Therefore, as shown in FIG. 7, the voltage VA of the A node rises to a voltage corresponding to the (n)th carry signal C(n).

The voltage VA of the A node may be maintained until the sensing period.

In this case, the storage signal transistor Ts2 may be turned on by the voltage VA of the A node, that is, the storage signal.

When the stage selection period P1 passes, the (n+1)th stage to the (g)th stage (stage g) are sequentially driven, whereby the carry signal and the gate pulse are output from each stage.

When the gate pulse is output to the first to (g)th gate lines GL1 to GLg in accordance with driving of the first stage to the (g)th stage stage 1 to stage g, the black image display period ends, and the sensing period starts.

Figure 8B:
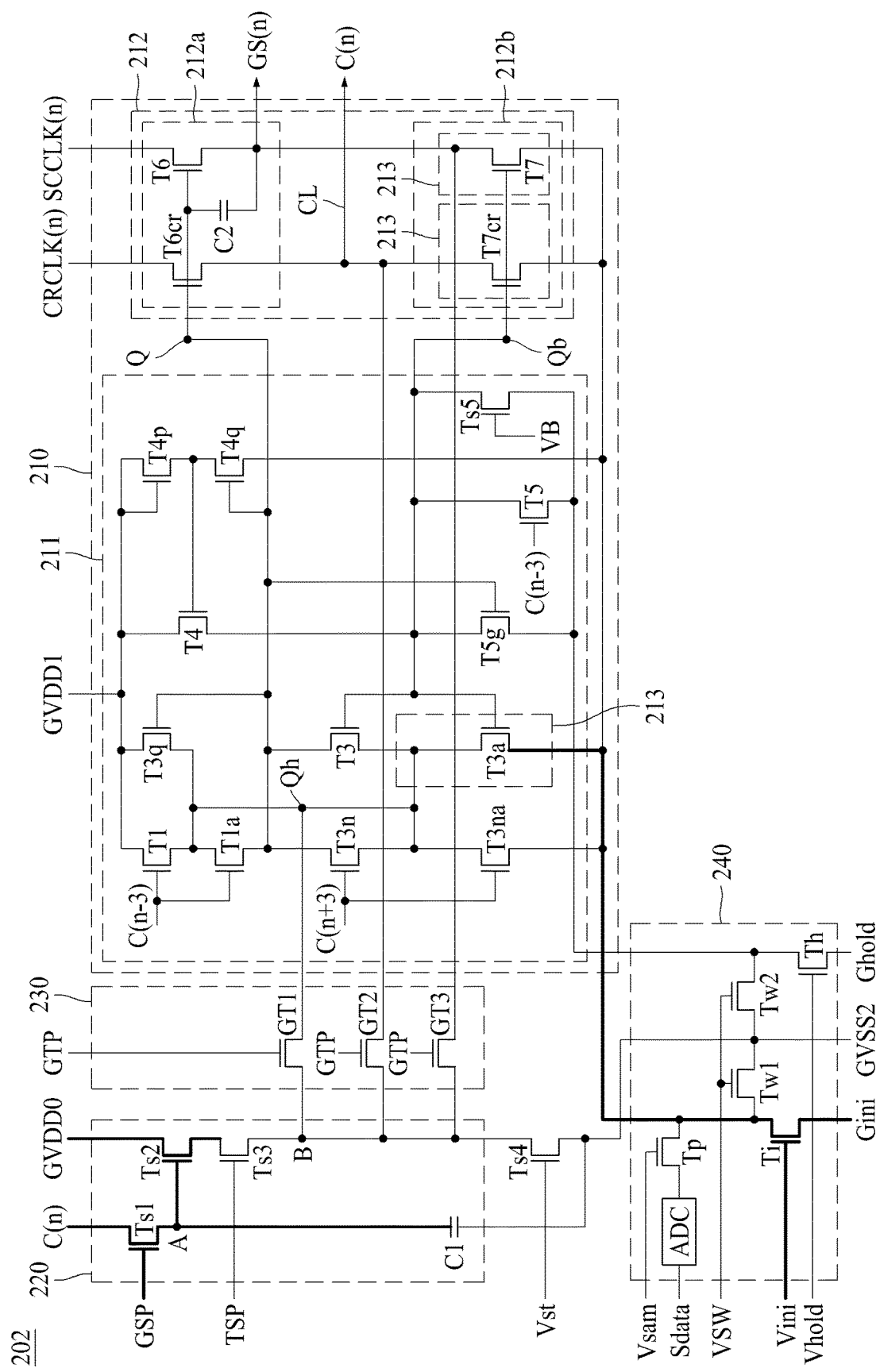

Next, when the sensing period starts, as shown in FIG. 8B, the second terminal of the sensing transistor 213 is initialized to the initialization voltage Gini.

That is, when an initialization period P2 of the sensing period starts, the controller 400 transmits the sensing initialization control signal Vini to the sensing unit 240 of the (n)th stage 202.

The initialization transistor Ti is turned on by the sensing initialization control signal Vini, and thus the initialization voltage Gini is supplied to the second terminal of the sensing transistor 213 through the initialization transistor Ti.

Therefore, the second terminal of the sensing transistor 213 is initialized to the initialization voltage Gini.

In this case, the voltage VA of the A node at the stage selection period P1 is maintained even at the initialization period P2.

Figure 8C:
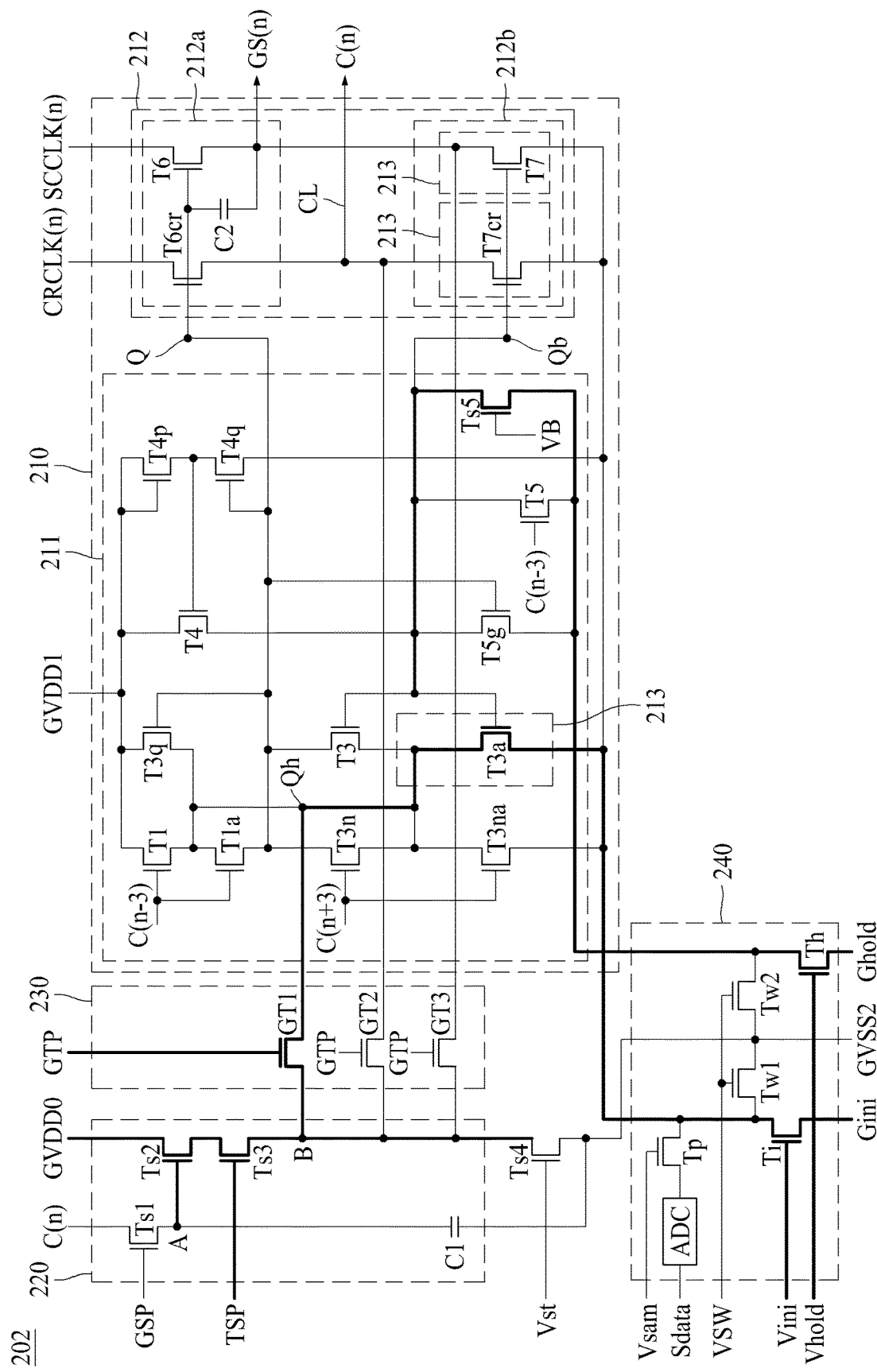

Next, after the initialization period P2 passes, a sensing transistor selection period P3 starts, and as shown in FIG. 8C, the sensing signal generated by the sensing transistor 213 may be transmitted to the sensing unit 240 at the sensing transistor selection period P3.

Any one of the sensing transistors 213 provided in the (n)th stage 202 is selected at the sensing transistor selection period P3. For example, the sensing transistor 213 provided in the signal driver 211 shown in FIGS. 6 and 8C may be selected at the sensing transistor selection period P3.

To this end, the controller 400 transmits the transistor selection control signal GTP to the gate of the selection transistor GT connected with the first terminal of the sensing transistor 213 at the sensing transistor selection period P3. In FIGS. 6 and 8C, the sensing transistor 213 provided in the signal driver 211 is connected to the first selection transistor GT1. Therefore, the controller 400 transmits the transistor selection control signal GTP to the gate of the first selection transistor GT1.

The first selection transistor GT1 is turned on by the transistor selection control signal GTP.

Also, the controller 400 transmits the timing selection control signal TSP to the gate of the sensing driving voltage transistor Ts3 at the sensing transistor selection period P3.

The sensing driving voltage transistor Ts3 is also turned on by the timing selection control signal TSP.

When the sensing driving voltage transistor Ts3 is turned on, the sensing driving voltage GVDD0 is applied to the first terminal of the first selection transistor GT1 through the storage signal transistor Ts2 and the sensing driving voltage transistor Ts3. In this case, since the first selection transistor GT1 is also turned on by the transistor selection control signal GTP, the sensing driving voltage GVDD0 is applied to the first terminal of the sensing transistor 213 through the first selection transistor GT1. The first terminal of the sensing transistor 213 is a Qh node Qh shown in FIG. 8C.

In addition, the controller 400 transmits the hold control signal Vhold to the sensing unit 240. When the hold transistor Th is turned on by the hold control signal Vhold, the hold voltage Ghold is connected to the QB node QB through the hold transistor Th and the (s5)th transistor Ts5. Since the QB node QB is connected to the gate of the sensing transistor 213, the sensing transistor 213 is turned on by a hold voltage Vhold. Therefore, the sensing signal based on the sensing driving voltage GVDD0 applied to the first terminal of the sensing transistor 213 is transmitted to the sensing unit 240.

In this case, the voltage of the second terminal of the sensing driving voltage transistor TS3, that is, the voltage VB of the B node is supplied to the gate of the (s5)th transistor Ts5. The voltage VB of the B node is the sensing driving voltage GVDD0 at the sensing transistor selection period P3 as described above. Therefore, the (s5)th transistor Ts5 may be turned on by the sensing driving voltage Ts5. Therefore, the hold voltage Ghold may be supplied to the gate of the sensing transistor 213 through the (s5)th transistor Ts5, and thus the sensing transistor 213 may be turned on.

Therefore, as shown in FIG. 8C, the sensing signal generated by the sensing transistor 213 may be transmitted to the sensing unit 240 at the sensing transistor selection period P3.

Figure 8D:
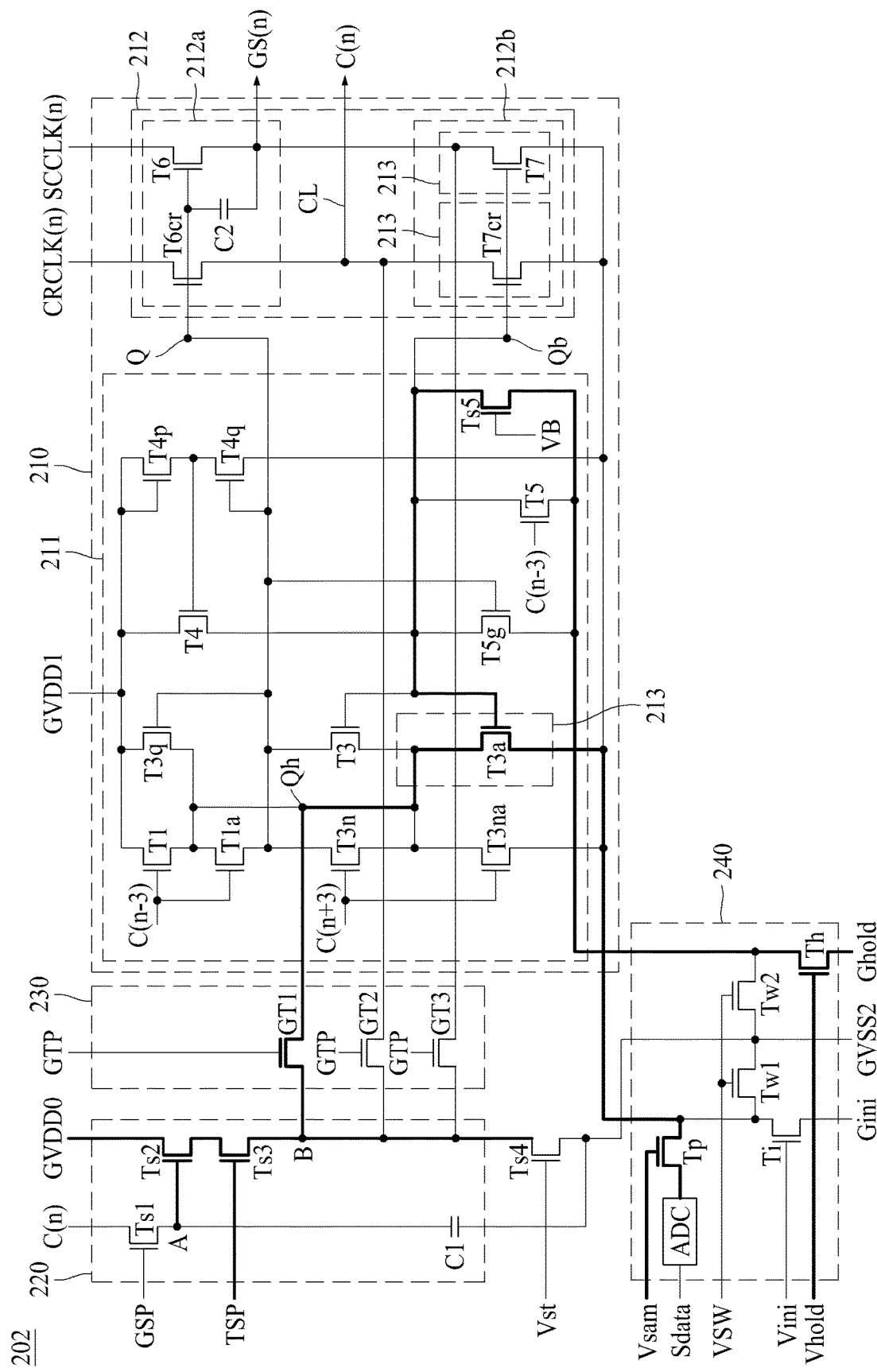

Next, when the sensing transistor selection period P3 ends, the sampling period P4 starts. As shown in FIG. 8D, the threshold voltage of the sensing transistor 213 may be sensed by the sensing unit 240 at the sampling period P4.

To this end, when the sampling period P4 starts, the controller 400 transmits the sampling control signal Vsam to the gate of the sampling transistor Tp. The sampling transistor Tp is turned on by the sampling control signal Vsam.

When the sampling transistor Tp is turned on, a sensing signal Vsen transmitted from the second terminal of the sensing transistor 213 is transmitted to the converter ADC through the sampling transistor Tp.

The converter ADC converts an analog type sensing signal Vsen into digital type sensing data Sdata and transmits the sensing data Sdata to the controller 400.

The controller 400 may determine the change amount of the threshold voltage of the sensing transistor 213 by using the sensing data Sdata.

For example, a magnitude of the sensed sensing signal (e.g., sensing voltage) before the sensing transistor 213 is degraded is different from a magnitude of the sensed sensing signal Vsen after the sensing transistor 213 is degraded, and thus the sensing data Sdata is changed.

Therefore, the controller 400 may identify a degradation level of the sensing transistor 213 by using the sensing data Sdata.

Finally, when the sampling period P4 passes, another black image display period may start. Also, when the sampling period P4 passes and the first period passes after the light emitting display panel is driven, the light emitting display apparatus may stop the output of the black image and then output an image corresponding to the input image data transmitted from the external system.

Before another black image display period starts after the sampling period P4 passes or before the image corresponding to the input image data transmitted from the external system is output after the sampling period P4 passes, as shown in FIG. 7, the first low voltage transistor Tw1 and the voltage sustain transistor Ts4 are turned on by a low voltage control signal VSW of a high level input to the gate of the first low voltage transistor Tw1 and a turn-off control signal Vst of a high level input to the gate of the voltage sustain transistor Ts4, whereby the A node A and the B node B may be initialized.

That is, as the A node A and the B node B are initialized by the initialization voltage Gini, the stage selection unit 220 and the transistor selection unit 230 are initialized. Therefore, the stage selection unit 220 and the transistor selection unit 230 may arbitrarily be driven to prevent the stage or the transistor from being arbitrarily selected.

In addition, after the sensing transistor is sensed, the stage selection unit 220 and the transistor selection unit 230 are initialized by the initialization voltage Gini, and after the stage selection unit 220 and the transistor selection unit 230 are initialized, a black image is output or an image corresponding to the input image data transmitted from the external system is output.

The method of sensing the sensing transistor in the light emitting display apparatus may be summarized as follows.

That is, as shown in FIG. 8A, the stage selection unit 220 stores the (n)th carry signal C(n) in accordance with the stage selection control signal GSP at the stage selection period P1 of the display period (black image display period) at which the black image is output from the light emitting display panel.

The sensing unit 240 initializes the second terminal of the sensing transistor 213 when the display period (black image display period) ends and the initialization period P2 starts.

When the initialization period P2 ends and the sensing transistor selection period P3 starts, the transistor selection unit 230 supplies the sensing driving voltage GVDD0 to the first terminal of the sensing transistor 213, and the sensing unit 240 supplies the hold voltage Ghold of the sensing transistor 213.

When the sensing transistor selection period P3 ends and the sampling period P4 starts, the sensing unit 240 converts the sensing signal received from the second terminal of the sensing transistor 213 into sensing data and transmits the sensing data to the controller 400.

After the light emitting display panel is driven and then the first period passes, while the image corresponding to the input image data transmitted from the external system is being output, the controller 400 may change the magnitude of the driving voltage supplied to the (n)th stage 202 in consideration of the threshold voltage of the sensing transistor 213 identified at the sensing period. To this end, the controller 400 may transmit the voltage supply control signal PCS to the voltage supply unit 500 to change the magnitude of the driving voltage.

In this case, the driving voltage may be a voltage supplied to the first terminal or the second terminal of the sensing transistor 213.

For example, the high voltage GVDD1 may be supplied to the first terminal of the sensing transistor 213 provided in the signal driver 211 shown in FIG. 6. Therefore, the driving voltage may be the high voltage GVDD1.

For example, when it is determined that a voltage lower than the high voltage GVDD1 that is currently supplied should be applied due to the change in the threshold voltage of the sensing transistor 213 by degradation, the controller 400 may transmit the voltage supply control signal PCS to the voltage supply unit 500 to reduce the magnitude of the high voltage GVDD1.

In addition, when it is determined that a voltage higher than the high voltage GVDD1 that is currently supplied should be applied due to the change in the threshold voltage of the sensing transistor 213 by degradation, the controller 400 may transmit the voltage supply control signal PCS to the voltage supply unit 500 to increase the magnitude of the high voltage GVDD1.

Therefore, the voltage supply unit 500 may supply the increased or reduced high voltage GVDD1 to the (n)th stage 202.

Also, when the carry-off signal transistor T7cr or the gate-off signal transistor T7 shown in FIG. 6 is the sensing transistor 213, the controller 400 may change the magnitude of the carry clock CRCLK(n) or the gate clock SCCLK(n) or change the magnitude of the second low voltage GVSS2.

According to the present disclosure described as above, even though the sensing transistor 213 provided in the stage 201 is degraded and performance of the sensing transistor 213 is changed, the driving voltage capable of stably maintaining performance of the sensing transistor 213 may be supplied to the sensing transistor 213.

Therefore, even though the light emitting display apparatus is used for a long time, the stage 201 may normally be driven. As a result, the gate driver 200 may normally be driven and thus quality of the light emitting display apparatus may be maintained.

According to the present disclosure, the following advantageous effects may be obtained.

According to the present disclosure, the change amount of the threshold voltage of the transistor, which may be degraded seriously, among the transistors constituting the stage may be sensed, and the magnitude of the driving voltage supplied to the transistor may be changed in accordance with the sensed change amount.

Therefore, the stage may be driven at an optimal state, and thus quality of the light emitting display apparatus may be improved.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting display apparatus comprising:
    a plurality of stages supplying gate signals to a plurality of gate lines provided in the light emitting display panel; and
    a controller configured to control a magnitude of a driving voltage among a plurality of driving voltages to be transmitted to the plurality of stages by using sensing data received from the plurality of stages,
    wherein an (n)th stage of the plurality of stages includes:
    a signal output unit outputting an (n)th gate signal to the plurality of gate lines;
    a signal driver driving the signal output unit;
    a stage selection unit storing an (n)th carry signal output from the signal output unit in accordance with a stage selection control signal received from the controller;
    a transistor selection unit transmitting a sensing driving voltage to a first terminal of a sensing transistor, which needs sensing, among transistors provided in the signal output unit or the signal driver in accordance with a storage signal stored in the stage selection unit and a transistor selection control signal received from the controller; and
    a sensing unit converting a sensing signal transmitted from a second terminal of the sensing transistor into sensing data and transmitting the sensing data to the controller.

2. The light emitting display apparatus of claim 1, wherein the first terminal of the sensing transistor is connected with the transistor selection unit,
    the second terminal of the sensing transistor is connected with the sensing unit,
    the sensing transistor has a gate connected to a QB node, and the signal output unit outputs a gate-off signal to the gate line by a QB signal supplied to the QB node.

3. The light emitting display apparatus of claim 1, wherein the stage selection unit includes:
- a stage selection transistor including a first terminal to which the (n)th carry signal is supplied, a gate to which the stage selection control signal is supplied, and a second terminal;
- a carry signal storage capacitor connected between the second terminal of the stage selection transistor and the sensing unit;
- a storage signal transistor including a gate to which a voltage stored in the carry signal storage capacitor is supplied, a first terminal to which the sensing driving voltage is supplied, and a second terminal; and
- a sensing driving voltage transistor including a gate to which a timing selection control signal transmitted from the controller is supplied, a first terminal connected with the second terminal of the storage signal transistor, and a second terminal connected with the transistor selection unit.

4. The light emitting display apparatus of claim 3, wherein the stage selection unit includes a voltage sustain transistor including a first terminal connected with the transistor selection unit, a second terminal connected with the sensing unit, and a gate to which a turn-off control signal is supplied.

5. The light emitting display apparatus of claim 1, wherein the transistor selection unit includes at least one selection transistor, and
wherein the selection transistor includes:
- a first terminal connected to the stage selection unit;
- a gate to which the transistor selection control signal is supplied; and
- a second terminal connected with the sensing transistor.

6. The light emitting display apparatus of claim 1, wherein the signal output unit includes:
- a gate pulse output unit for outputting a gate pulse and the (n)th carry signal in accordance with a Q node signal; and
- a gate-off signal output unit for outputting a gate-off signal in accordance with a QB node signal having a phase opposite to that of the Q node signal, and
wherein the gate-off signal output unit includes:
- a carry-off signal transistor including a first terminal connected with a carry signal output line to which the (n)th carry signal is output, a second terminal connected with the sensing unit, and a gate to which the QB node signal is supplied; and
- a gate-off signal transistor including a first terminal connected with a gate line to which the gate pulse is output, a second terminal connected with the sensing unit, and a gate to which the QB node signal is supplied.

7. The light emitting display apparatus of claim 6, wherein at least one of the carry-off signal transistor and the gate-off signal transistor is the sensing transistor.

8. The light emitting display apparatus of claim 1, wherein the sensing unit senses a change amount of a threshold voltage of the sensing transistor at a blank period between display periods at which an image is output from the light emitting display panel, so as to generate the sensing data.

9. The light emitting display apparatus of claim 8, wherein a black image is output from the light emitting display panel at the display period until a first period passes after the light emitting display panel is driven, and after the first period passes, an image corresponding to input image data supplied from an external system is output from the light emitting display panel at the display period.

10. The light emitting display apparatus of claim 1, wherein the sensing unit includes:
- an initialization transistor initializing the second terminal of the sensing transistor;
- a hold transistor supplying a hold voltage that turns on the sensing transistor to a gate of the sensing transistor;
- a converter converting the sensing signal into the sensing data; and
- a sampling transistor transmitting the sensing signal transmitted from the second terminal of the sensing transistor to the converter.

11. The light emitting display apparatus of claim 1, wherein the sensing unit includes:
- an initialization transistor including a first terminal connected with the second terminal of the sensing transistor, a gate to which a sensing initialization control signal is supplied, and a second terminal to which an initialization voltage to be supplied to the second terminal of the sensing transistor is supplied;
- a hold transistor including a first terminal connected with the gate of the sensing transistor, a gate to which a hold control signal is supplied, and a second terminal to which a hold voltage capable of turning on the sensing transistor is supplied;
- a converter converting the sensing signal into the sensing data; and
- a sampling transistor including a first terminal connected with the second terminal of the sensing transistor, a second terminal connected with the converter, and a gate to which a sampling control signal is supplied.

12. The light emitting display apparatus of claim 1, wherein the stage selection unit stores the (n)th carry signal in accordance with the stage selection control signal at a display period at which a black image is output from the light emitting display panel,
the sensing unit initializes the second terminal of the sensing transistor when the display period ends and an initialization period starts,
when the initialization period ends and a sensing transistor selection period starts, the transistor selection unit supplies the sensing driving voltage to the first terminal of the sensing transistor and the sensing unit supplies a hold voltage to a gate of the sensing transistor, and
when the sensing transistor selection period ends and a sampling period starts, the sensing unit converts the sensing signal received from the second terminal of the sensing transistor into the sensing data.

13. The light emitting display apparatus of claim 1, wherein the controller controls a magnitude of a driving voltage, which is to be supplied to the sensing transistor, among the plurality of driving voltages to be transmitted to the stages, by using sensing data received from the stages.

* * * * *